US006468927B1

(12) United States Patent
Zhang et al.

(10) Patent No.: US 6,468,927 B1
(45) Date of Patent: Oct. 22, 2002

(54) METHOD OF DEPOSITING A NITROGEN-DOPED FSG LAYER

(75) Inventors: Lin Zhang, San Jose; Wen Ma, Milpitas; Zhuang Li, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/574,271

(22) Filed: May 19, 2000

(51) Int. Cl.[7] .................. H01L 21/31; H01L 21/469; H01L 21/26
(52) U.S. Cl. ............... 438/779; 438/763; 438/778; 438/783; 438/795; 438/958
(58) Field of Search ................... 438/779, 763, 438/778, 783, 795, 958, 692, 710, 788, 758, 723, 780, 789; 427/579, 578, 575, 571, 535, 569, 255; 118/723, 715, 733

(56) References Cited

U.S. PATENT DOCUMENTS

| 5,013,691 | A | | 5/1991 | Lory et al. .................. 437/238 |
| 5,869,149 | A | * | 2/1999 | Denison et al. ............. 427/579 |
| 6,054,379 | A | * | 4/2000 | Yau et al. .................... 438/623 |
| 6,070,551 | A | * | 6/2000 | Li et al. ..................... 118/723.1 |
| 6,303,518 | B1 | * | 10/2001 | Tian et al. ................... 438/758 |
| 6,372,291 | B1 | * | 4/2002 | Hua et al. ................. 427/255.28 |

* cited by examiner

*Primary Examiner*—Matthew Smith
*Assistant Examiner*—Igwe W. Anya
(74) *Attorney, Agent, or Firm*—Townsend & Townsend & Crew

(57) ABSTRACT

Gap-fill and damascene methods are disclosed for depositing an insulating thin film of nitrofluorinated silicate glass on a substrate in a process chamber. A high-density plasma, generated from a gaseous mixture of silicon-, fluorine-, oxygen-, and nitrogen-containing gases, deposits a layer of nitrofluorinated silicate glass onto the substrate. For gap-fill applications, the substrate is biased with a bias power density between 4.8 and 11.2 W/cm$^2$ and the ratio of flow rate for the oxygen-containing gas to the combined flow rate for all silicon-containing gases in the process chamber is between 1.0 and 1.8, preferably between 1.2 and 1.4. For damascene applications, the bias power density is less than 3.2 W/cm$^2$, preferably 1.6 W/cm$^2$, and the flow rate ratio is between 1.2 and 3.0. Using optimized parameters, the thin film has a lower dielectric constant and better adhesion properties than fluorosilicate glass.

34 Claims, 8 Drawing Sheets

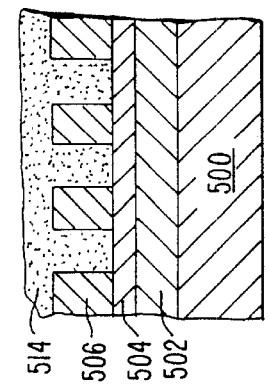
FIG. 3A.
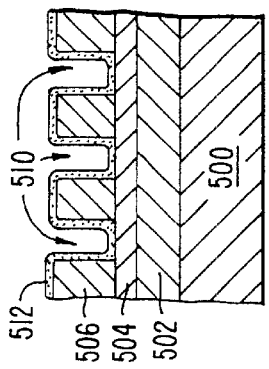
FIG. 3B.
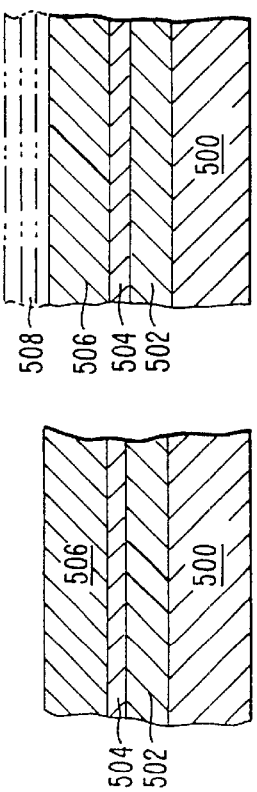
FIG. 3C.
FIG. 3D.
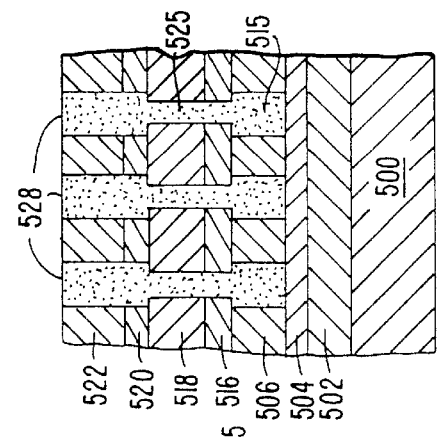
FIG. 3E.
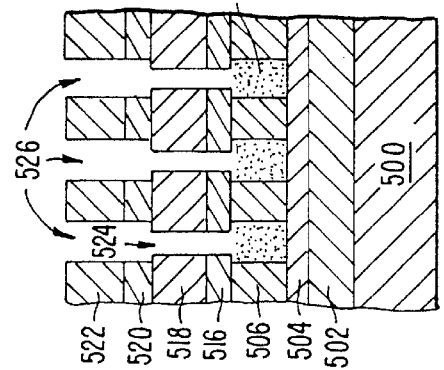
FIG. 3F.
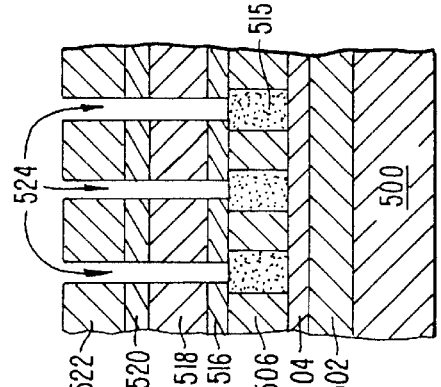
FIG. 3G.
FIG. 3H.

METHOD OF DEPOSITING A NITROGEN-DOPED FSG LAYER

BACKGROUND OF THE INVENTION

The present invention relates to the manufacture of integrated circuits, and more specifically to a method for depositing a nitrogen-doped FSG film for use in such circuits. Films deposited according to the present invention are useful in various applications, and are particularly useful in the formation of intermetal dielectric layers and in copper damascene applications.

In conventional integrated circuit fabrication, circuit elements are formed by etching a pattern of gaps in a layer of metal, which are then filled with a dielectric. As efforts continue to include ever greater levels of integration on semiconductor chips, there has developed a persistent need to make circuit components (such as transistors, capacitors, etc.), smaller, bringing the components closer together, thereby allowing a greater number of components per unit of chip area. Increasing the component density on semiconductor chips results in increased sensitivity of operating speed and power consumption on the dielectric constant k of the material used to insulate the electrically conductive structures. If the dielectric constant is too high, the capacitance between the chip's metal lines becomes too large, creating undesirable cross talk across layers.

Various forms of silicon oxide or silicon-oxide-based glass are commonly used as the insulating material in integrated-circuit fabrication. While silicon oxide has an acceptably low dielectric constant for many applications, a lower dielectric constant is preferable for some applications, such as those involving a high density of circuit components. The lower dielectric constant reduces RC time delays, contributing to an overall improvement in the circuit's operation speed. One method of forming an insulator with a lower dielectric constant than undoped silicate glass ("USG") involves adding fluorine to silicon oxide during a chemical-vapor-deposition ("CVD") process. The presence of the fluorine dopants in the resulting fluorinated silicate glass ("FSG") is known to have the desired lowering effect on dielectric constant.

Another factor to be considered in developing methods for depositing films with appropriate dielectric constant is that copper, which has lower resistance than conventional aluminum alloys, is poised to take over as the main on-chip conductors for all types of integrated circuits. It is more difficult to etch copper than aluminum and a specialized process, referred to as a "damascene process," has therefore been developed for the fabrication of copper-based integrated circuits. Thus, in damascene processes, dielectric layers are first deposited as an integrated stack, which is then etched to form gaps to be subsequently filled with the conductive material. A barrier layer, which can be overlying or underlying, is commonly included to prevent diffusion of copper into adjacent dielectric layers. Some integrated stacks used in damascene processes also use a layer known as an "etch stop" or "hardmask" to provide for selective etching of the film. Silicon nitride ($Si_xN_y$) is a material commonly used for such applications, for example when forming vias between layers containing metal lines.

Deposition of USG and FSG films for both gap-fill and damascene applications has previously been undertaken in high-density plasma ("HDP") CVD systems. In such systems, deposition is accomplished by forming a plasma in a chamber from a mixture of gases containing the necessary elemental constituents of the desired film. In the case of gap-fill applications, the wafer may be processed in the plasma while a bias is applied to the wafer. The bias accelerates ions from the plasma to the wafer so that the wafer is bombarded—material that might prematurely close the gap is sputtered away while material from the plasma simultaneously deposits to fill the gap. The FSG gap-fill process is a generally good process scheme in terms of reliability, stability and throughput. HDP-FSG films deposited in gap-fill applications typically have a fluorine concentration of about 5.5–7.0 atomic percent (at.%) and a dielectric constant k of about 3.7, compared to a value of k about 4.0 to 4.3 for conventional undoped silicon oxides.

While the use of FSG has provided an insulating material with a reduced dielectric constant compared to USG, further reductions remain desirable because such decreases translate directly into increased operation speed and circuit performance. It is further desirable to be able to deposit a film with the desired decreased dielectric constant while simultaneously achieving greater stability for the film.

SUMMARY OF THE INVENTION

Embodiments of the present invention provide such a silicate-glass-based insulator having both a lower dielectric constant and improved stability. By including a nitrogen-containing gas in the mixture that is supplied to the deposition chamber (in addition to the gases otherwise used to produce FSG), a nitrofluorinated silicate glass ("NFSG") film can be deposited on a substrate. Such an NFSG film has a dielectric constant approximately 5% lower than the dielectric constant of an FSG layer deposited without using a nitrogen-containing gas, but under otherwise similar conditions. This reduction in dielectric constant, attributable to the inclusion of nitrogen dopants in the film, permits increased device speed, and the enhanced stability exhibited by the film lessens integration concerns that otherwise exist with both FSG and USG. The NFSG layer also exhibits excellent adhesion to an overlying or underlying barrier layer as may be required in certain embodiments. Various embodiments of the invention are applicable both to damascene and gap-fill applications. The gap-fill capability of an NFSG layer is also improved over FSG or USG films deposited under otherwise similar conditions.

In one embodiment that is amenable to gap-fill applications, a method is provided for depositing an NFSG film on a substrate in which a gaseous mixture of silicon-containing, fluorine-containing, oxygen-containing, and nitrogen-containing gases is provided to a chamber. A high-density plasma is generated from the gaseous mixture, where "high-density" is understood in this context to mean having an ion density that is equal to or exceeds $10^{11}$ ions/cm$^3$. A bias is applied to the substrate at a bias power density between 4.8 and 11.2 W/cm$^2$, and the NFSG layer is deposited onto the substrate using the plasma. In one particular embodiment, the bias power density is 8.3 W/cm$^2$. In a preferred embodiment, the nitrogen-containing gas is $N_2$, but may be a different nitrogen-containing gas such as $N_2O$, $NH_3$, or $NF_3$. The fluorine-containing gas is preferably $SiF_4$ and the silicon-containing gas is preferably a silane. The ratio of flow rate for the oxygen-containing gas to the combined flow rate for all silicon-containing gases in the gaseous mixture should be between 1.0 and 1.8, and preferably within the range of 1.2–1.4. The $N_2$ flow rate should be in the range 10–60 sccm, preferably 20–40 sccm, which may be adjusted as appropriate for alternative nitrogen-containing gases according to their stoichiometry. Using optimized parameters results in deposition of an NFSG film with a lower dielectric constant and better adhesion properties than FSG. The method provides a gap-fill capability that can substantially fill a gap with an aspect ratio greater than 3.2:1.

In another embodiment that is amenable to damascene applications, a method is provided for depositing an NFSG film on a substrate by providing a gaseous mixture of silicon-, fluorine-, oxygen-, and nitrogen-containing gases to a chamber, from which a high-density plasma is generated. A bias with a power density between 0.0 and 3.2 W/cm$^2$ is applied to the substrate and the NFSG layer is deposited using the plasma. For damascene applications, the bias power density is preferably 1.6 W/cm$^2$, and the ratio of flow rates of oxygen-containing to all silicon-containing gases in the gaseous mixture is between 1.2 and 3.0, with a preferred range of 1.8–2.5. As for the embodiments amenable to gap-fill applications, it is preferred that the nitrogen-containing gas be $N_2$, although other gases such as $N_2O$, $NH_3$, or $NF_3$ may also be used; the preferred fluorine-containing gas is $SiF_4$, and the preferred silicon-containing gas is a silane. The $N_2$ flow rate is preferably in the range 30–120 sccm, although this rate may be adjusted when using alternative nitrogen-containing gases according to their stoichiometry. In related embodiments, the NFSG layer is deposited on a barrier layer previously formed on the substrate; the barrier layer is preferably a silicon nitride layer. Where the NFSG layer is deposited as part of a damascene process, it is preferred that the substrate be heated by an in situ plasma that does not contain oxygen prior to depositing the NFSG layer. As for the gap-fill applications, use of optimized parameters permits deposition of an NFSG film with a lower dielectric constant and better adhesion properties than FSG.

The methods of the present invention may be embodied in a computer-readable storage medium having a computer-readable program embodied therein for directing operation of substrate processing system. Such a system may include a process chamber, a plasma generation system, a substrate holder, a gas delivery system, and a system controller. The computer-readable-program includes instructions for operating the substrate processing system to form a thin film on a substrate disposed in the processing chamber in accordance with the embodiments described above.

BRIEF DESCRIPTION OF THE DRAWINGS

The present invention, as well as its advantages and features, is now described in detail with reference to the accompanying drawings, wherein:

FIGS. 3(a)–3(h) depict a cross-section of a partially formed integrated circuit undergoing an integrated dual-damascene process according to an embodiment of the present invention;

DESCRIPTION OF THE SPECIFIC EMBODIMENTS

I. Introduction

The present invention is directed to a method and apparatus for depositing a nitrofluorinated silicate glass ("NFSG") film on a substrate. With optimized gas flow rates, source power density, and bias power density, the deposited NFSG film has a reduced dielectric constant when compared with similarly deposited USG or FSG films. The resulting NFSG layer exhibits excellent adhesion to an overlying or underlying barrier layer such as silicon nitride ($S_xN_y$) as may be required in some embodiments. The NFSG layer also exhibits enhanced stability, thereby reducing integration concerns that exist with FSG. In embodiments where the NFSG film is deposited for gap-fill applications, there is improved gap-fill capability with 100% gap-fill being achieved for higher aspect ratios. In addition to gap-fill embodiments, the invention is also described below for use in damascene applications.

II. Exemplary Substrate Processing System

Figure 1A:
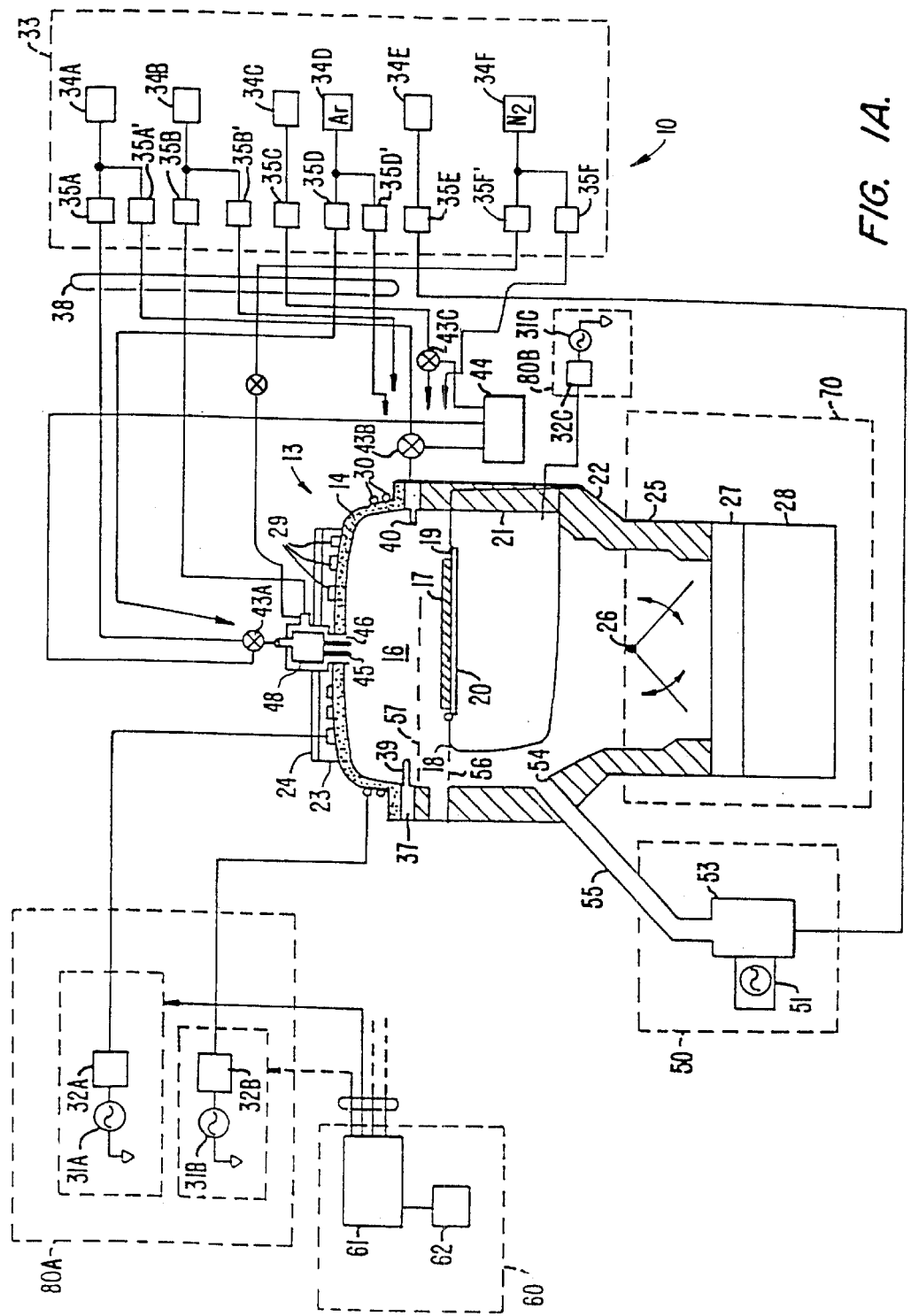
FIG. 1A is a simplified diagram of one embodiment of a high density chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas-delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. In one embodiment the arrangement of the throttle valve, gate valve, and turbo-molecular pump allow accurate and stable control of chamber pressures from between about 1 millitorr to about 2 torr and provide a pumping capacity of 22 liters/min.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complementary electrode. In a specific embodiment, the top source RF generator 31A provides up to 2,500 watts of RF power at nominally 2 MHz and the side source RF generator 31B provides up to 5,000 watts of RF power at between 1.8 and 2.2 MHz, nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complementary electrodes. The bias plasma system 80B serves to enhance the transport of plasma species (e.g., ions) created by the source plasma system 80A to the surface of the substrate. BRF generator 31C provides RF power at a frequency ranging from about 1–100. In a specific embodiment, BRF generator 31C provides up to 5,000 watts of RF power at 13.56 MHz.

RF generators 31A and 31B include digitally controlled synthesizers and operate over a frequency range between about 1.8 to about 2.2 MHz. Each generator includes an RF control circuit (not shown) that measures reflected power from the chamber and coil back to the generator and adjusts the frequency of operation to obtain the lowest reflected power, as is understood to a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
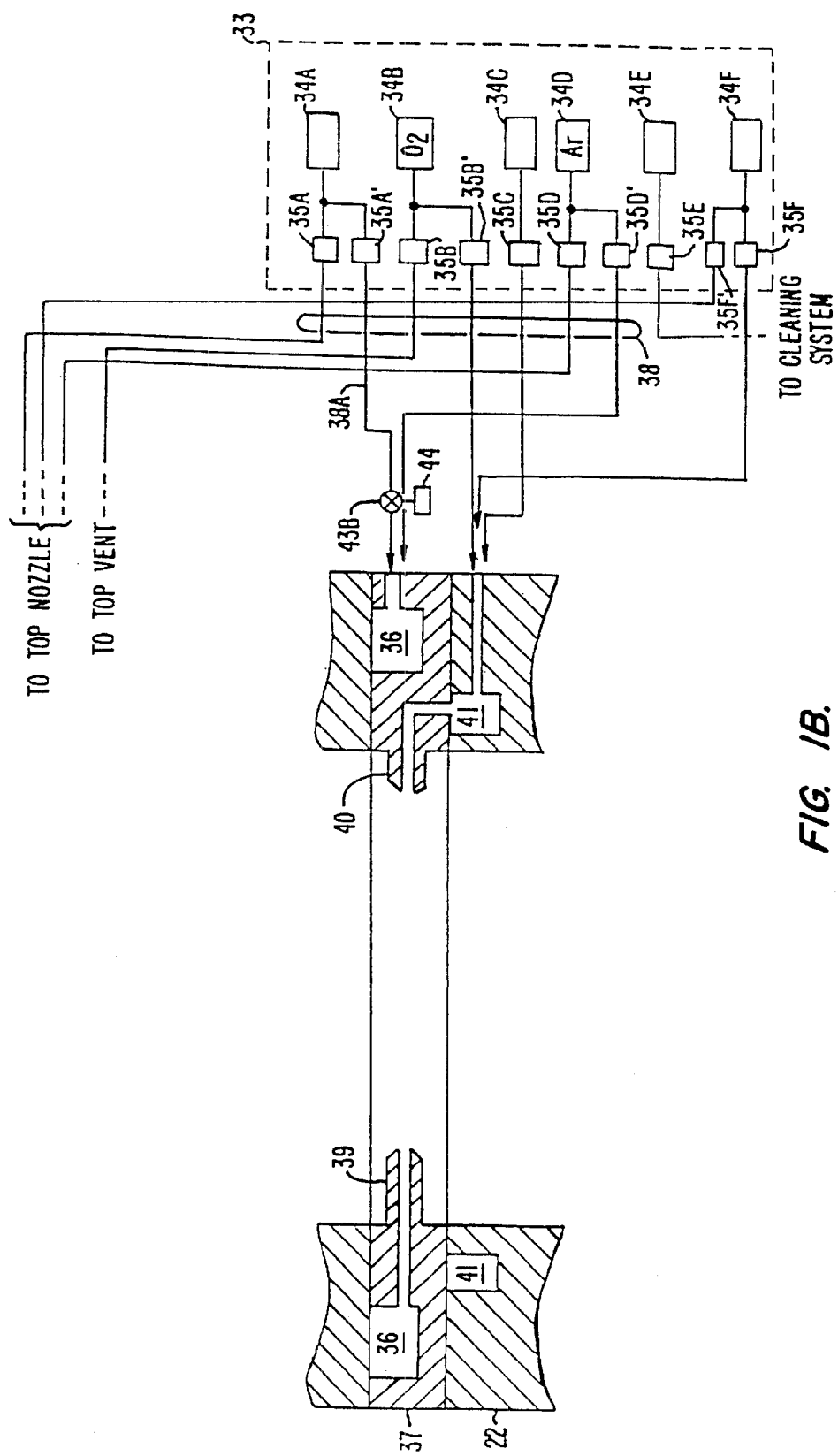
FIG. 1B is a simplified vertical cross section of a gas ring that may be used in conjunction with the exemplary CVD processing chamber of FIG. 1A.

A gas delivery system 33 provides gases from several sources, 34A–34F, to the chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown in FIG. 1B for purposes of illustration) that provide a uniform flow of gas over the substrate. Nozzle length and nozzle angle may be changed to allow tailoring of the uniformity profile and gas utilization efficiency for a particular process within an individual chamber.

Gas ring 37 also has a plurality of oxidizer gas nozzles 40 (only one of which is shown), which are preferably the same length as the source gas nozzles 39, but are co-planar with and shorter than source gas nozzles 39 in some embodiments. In one embodiment, the oxidizer gas nozzles 40 receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. The nitrogen source 34F provides nitrogen-containing gas ($N_2$ in the preferred embodiment, although other gases such as $N_2O$, $NH_3$, or $NF_3$ may also be used) to oxidizer nozzles 40 of the gas ring 37 to the chamber. Alternatively, the nitrogen-containing gas can be delivered to the chamber through a source-gas nozzle or through other or additional inlets, such as the top nozzle 45 via gas flow controller 35F'. Additional valves, such as 43B (other valves not shown), may shut off gas from the flow controllers to the chamber. In a preferred embodiment, the gas nozzles 39 and 40 of gas ring 37 are made from an aluminum oxide ceramic.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFC's 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

Figure 1C:
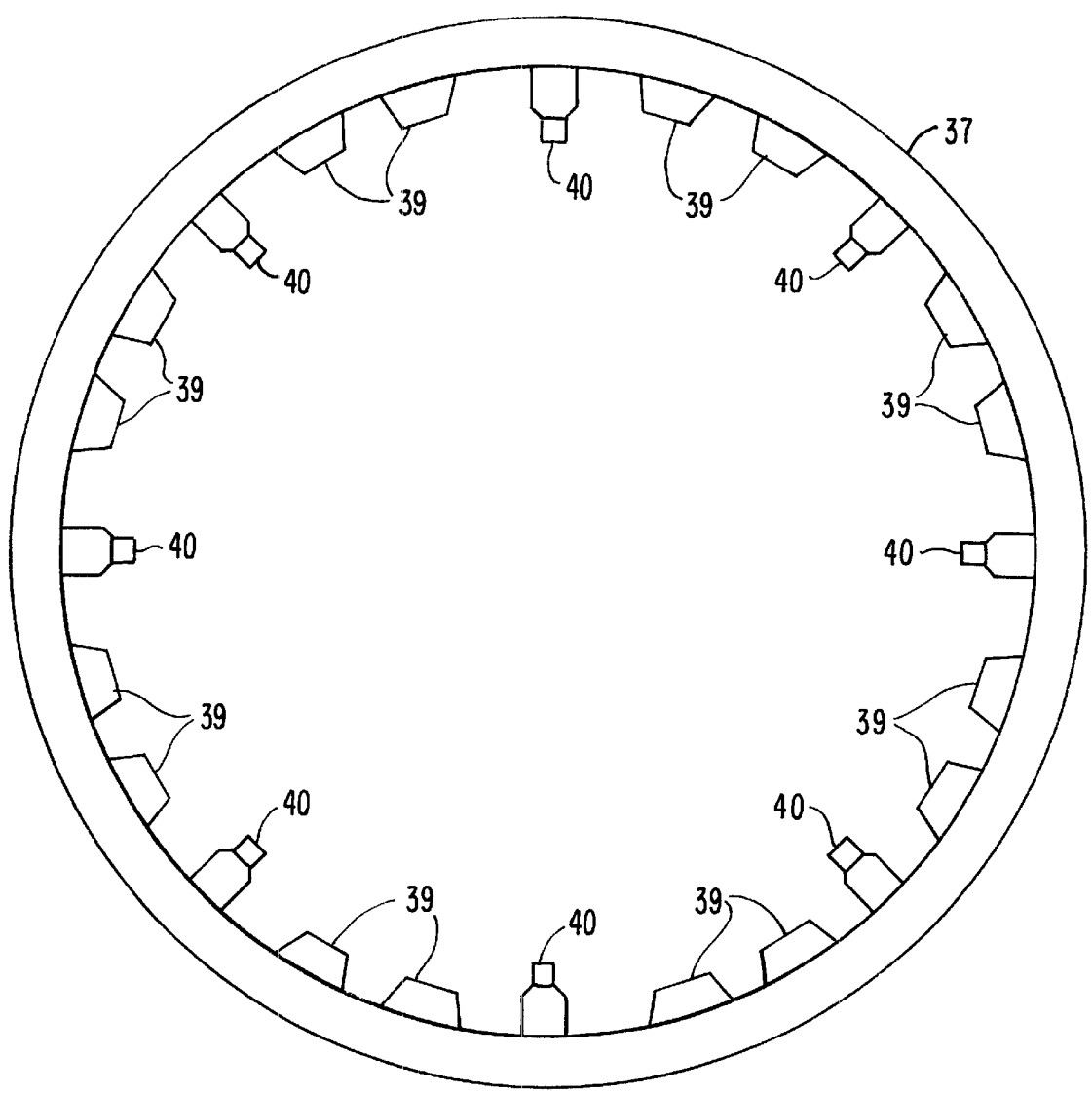
FIG. 1C is a simplified horizontal cross section of a gas ring that may be used in conjunction with the exemplary CVD processing chamber of FIG. 1A.

The configuration of source gas nozzles 39 and oxidizer gas nozzles 40 may be important in certain embodiments of the present invention. FIG. 1C depicts a simplified horizontal cross section of an embodiment of gas ring 37 depicted in FIG. 1B. In this embodiment gas ring 37 comprises 16 source nozzles 39 uniformly distributed about a periphery of gas ring 37. Gas ring 37 further comprises 8 oxidizer gas nozzles 40 uniformly distributed about the periphery of gas ring 37. In an alternative embodiment, gas ring 37 comprises 12 source nozzles 39 and 6 oxidizer gas nozzles 40 uniformly distributed about the periphery of gas ring 37.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube (CRT) 65, and a light pen 66, as depicted in FIG. 1D.

Figure 1D:
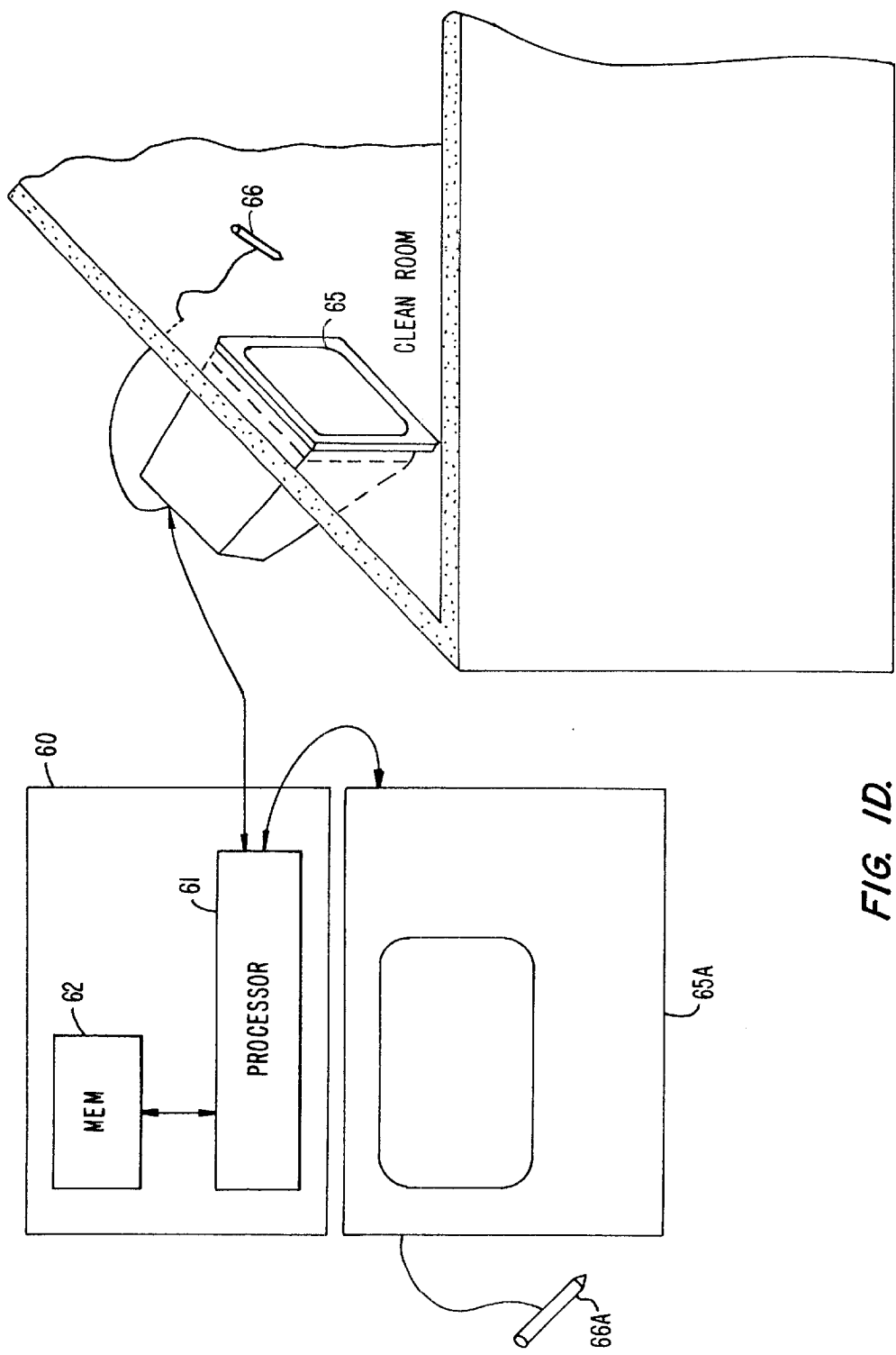
FIG. 1D is a simplified diagram of a monitor and light pen that may be used in conjunction with the exemplary CVD processing chamber of FIG. 1A.

FIG. 1D is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The area touched confirms being selected by the light pen by changing its color or displaying a new menu, for example.

The computer program code can be written in any conventional computer-readable programming language such as 68000 assembly language, C, C++, FORTRAN, Pascal or other language. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1E:
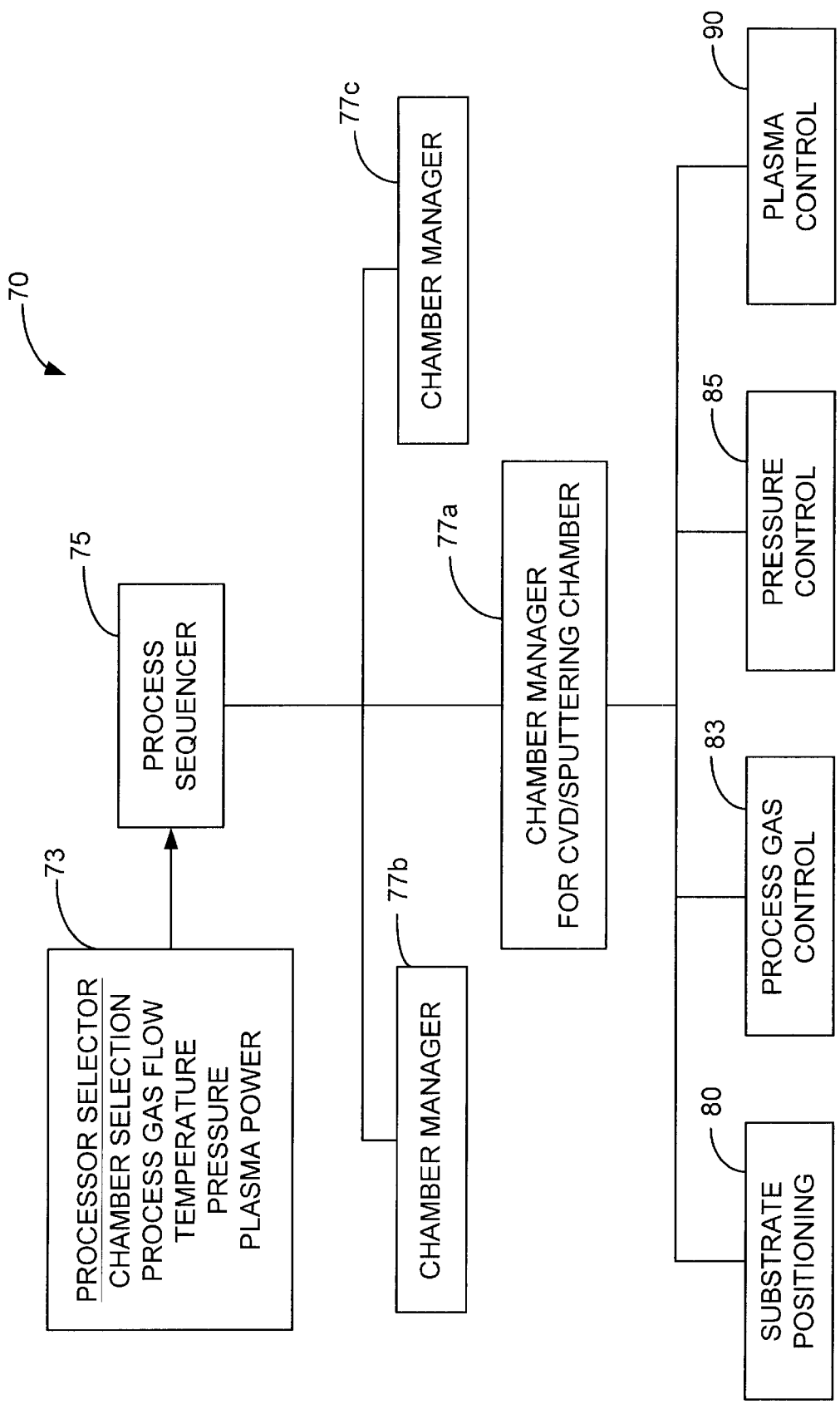
FIG. 1E is a flowchart of an exemplary process control computer program product used to control the exemplary CVD processing chamber of FIG. 1A.

FIG. 1E shows an illustrative block diagram of the hierarchical control structure of computer program 70. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. Process selector subroutine 73 identifies (i) the desired process chamber in a multichamber system, and (ii) the desired set of process parameters needed to operate the process chamber for performing the desired process. The process parameters for performing a specific process relate to conditions such as process gas composition and flow rates, substrate temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 75 comprises program code for accepting the identified process chamber and set of process parameters from the process selector subroutine 73 and for controlling operation of the various process chambers. Multiple users can enter process set numbers and process chamber numbers, or a single user can enter multiple process set numbers and process chamber numbers; sequencer subroutine 75 schedules the selected processes in the desired sequence. Preferably, sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 can be designed to take into consideration the "age of each particular user-entered request, or the present condition of the process chamber being used in comparison with the desired process conditions for a selected process, or any other relevant factor a system programmer desires to include for determining scheduling priorities.

After sequencer subroutine 75 determines which process chamber and process set combination is going to be executed next, sequencer subroutine 75 initiates execution of the process set by passing the particular process set parameters to a chamber manager subroutine 77a–c, which controls multiple processing tasks in chamber 13 and possibly other chambers (not shown) according to the process set sent by sequencer subroutine 75.

Examples of chamber component subroutines are substrate positioning subroutine 80, process gas control subroutine 83, pressure control subroutine 85, and plasma control subroutine 90. Those having ordinary skill in the art will recognize that other chamber control subroutines can be included depending on what processes are selected to be performed in chamber 13. In operation, chamber manager subroutine 77a selectively schedules or calls the process component subroutines in accordance with the particular process set being executed. Chamber manager subroutine 77a schedules process component subroutines in the same manner that sequencer subroutine 75 schedules the process chamber and process set to execute. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1E. Substrate positioning subroutine 80 comprises program code for controlling chamber components that are used to load a substrate onto substrate support number 18. Substrate positioning subroutine 80 may also control transfer of a substrate into chamber 13 from, e.g., a PECVD reactor or other reactor in the multi-chamber system, after other processing has been completed.

Process gas control subroutine 83 has program code for controlling process gas composition and flow rates. Subroutine 83 controls the open/close position of the safety shut-off valves and also ramps up/ramps down the mass flow controllers to obtain the desired gas flow rates. All chamber component subroutines, including process gas control subroutine 83, are invoked by chamber manager subroutine 77a. Subroutine 83 receives process parameters from chamber manager subroutine 77a related to the desired gas flow rates.

Typically, process gas control subroutine 83 opens the gas supply lines, and repeatedly (i) reads the necessary mass flow controllers, (ii) compares the readings to the desired flow rates received from chamber manager subroutine 77a, and (iii) adjusts the flow rates of the gas supply lines as necessary. Furthermore, process gas control subroutine 83 may include steps for monitoring the gas flow rates for unsafe rates and for activating the safety shut-off valves when an unsafe condition is detected.

Some processes flow an inert gas, such as argon, into chamber 13 to stabilize the pressure in the chamber before reactive process gases are introduced. For these processes, the process gas control subroutine 83 is programmed to include steps for flowing the inert gas into chamber 13 for an amount of time necessary to stabilize the pressure in the chamber. The steps described above may then be carried out.

Additionally, when a process gas is to be vaporized from a liquid precursor, the process gas control subroutine 83 may include steps for bubbling a delivery gas such as helium through the liquid precursor in a bubbler assembly or for introducing the helium to a liquid injection valve. For this type of process, the process gas control subroutine 83 regulates the flow of the delivery gas, the pressure in the bubbler, and the bubbler temperature to obtain the desired process gas flow rates. As discussed above, the desired process gas flow rates are transferred to process gas control subroutine 83 as process parameters.

Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 83 may also control the flow of heat-transfer gas, such as helium (He), through the inner and outer passages in the wafer chuck with an independent helium control (IHC) subroutine (not shown). The gas flow thermally couples the substrate to the chuck. In a typical process, the plasma and the chemical reactions that form the layer heat the wafer, and the He cools the substrate through the chuck, which may be water-cooled. This keeps the substrate below a temperature that may damage preexisting features on the substrate.

Pressure control subroutine 85 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 85, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 85 is invoked, the desired, or target, pressure level is received as a parameter from chamber manager subroutine 77a. Pressure control subroutine 85 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 85 may open or close throttle valve 26 to a particular opening size to regulate the pressure in chamber 13 to a desired pressure or pressure range.

Plasma control subroutine 90 comprises program code for controlling the frequency and power output setting of RF generators 31A and 31B and for tuning matching networks 32A and 32B. Plasma control subroutine 90, like the previously described chamber component subroutines, is invoked by chamber manager subroutine 77a.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. Exemplary Structures

Figure 2:
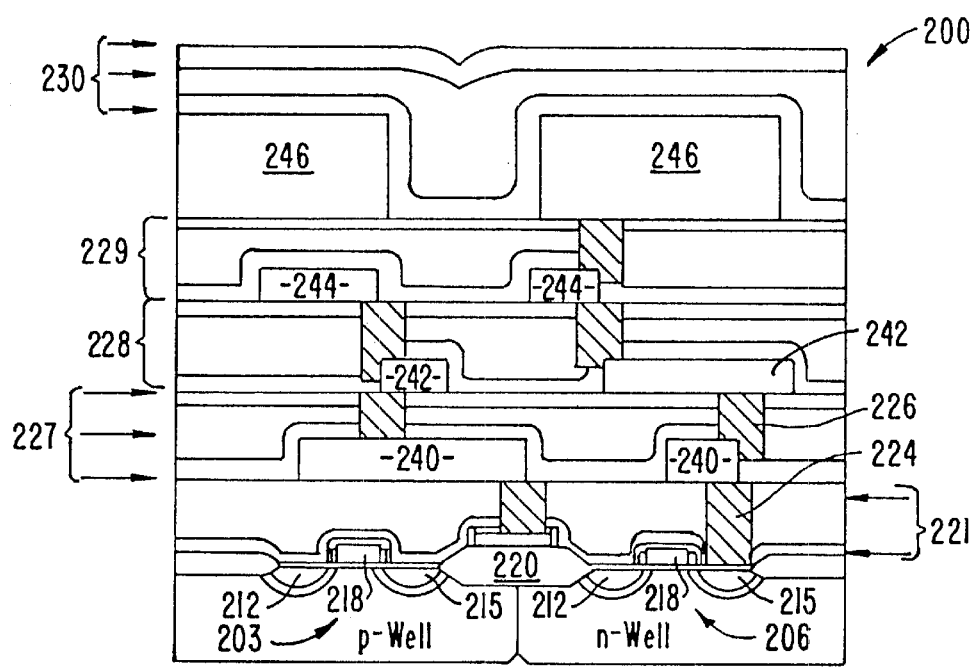
FIG. 2 is a simplified cross-sectional view of a semiconductor device manufactured according to the method of the present invention.

FIG. 2 illustrates a simplified cross-sectional view of an integrated circuit 200, which may be made in accordance with use of the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by a groove trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, and 246 is separated from adjacent metal layers by respective intermetal dielectric (IMD) layers 227, 228, or 229. Any or all of IMD layers 227, 228, or 229 can be deposited in accordance with embodiments of the present invention. Adjacent metal layers are connected at selected openings by vias 226. Deposited over metal layer 246 are planarized passivation layers 230.

It should be understood that simplified integrated circuit 200 is for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to PMOS, NMOS, CMOS, bipolar, or BiCMOS devices.

IV. Exemplary Damascene Process

An example of a dual-damascene process integration scheme that uses the NFSG layer deposition of the present invention in forming an IMD layer is depicted in FIGS. 3(a)–3(h). The dual damascene process begins with the deposition of an oxide layer 502 over a silicon substrate 500 as shown in FIG. 3(a). A barrier layer 504 is deposited over oxide layer 502, e.g., by HDP-CVD using $SiH_4$ and $N_2$ or PECVD using $SiH_4+NH_3/N_2$. In some applications layer 504 acts as a hardmask or etch-stop layer. A first NFSG layer 506 is deposited, e.g., using the HDP-CVD method described above. First NFSG layer 506 may be deposited in the same chamber as barrier layer 504 to enhance process integration. A first patterned photoresist layer 508 covers NFSG layer 506 during a first photolithography as shown in FIG. 3(b). A first etch forms a first set of gaps 510 in first NFSG layer 506 down to hardmask layer 504 as shown in FIG. 3(c).

After the first etch, photoresist 508 is stripped, e.g., by ashing in an oxidizing environment. Gaps 510 and first NFSG layer 506 are then covered with a layer of metal, such as aluminum or copper. In the case of copper, a seed layer 512 (FIG. 3(c)) is deposited over gaps 510 and first NFSG layer 506. A first bulk copper layer 514 is deposited to fill the gaps 510 as shown in FIG. 3(d). In some applications, a barrier layer (not shown) is deposited over first NFSG layer 506 and gaps 510 prior to deposition of seed layer 512. The barrier layer prevents interdiffusion of copper and NFSG. Copper layer 514 is planarized, e.g., by chemical and mechanical polishing (CMP). Planarization of copper layer 514 forms, e.g., a first set of metal lines 515 in an interconnect structure.

After planarization, of copper layer 514, a second barrier layer 516, a second NFSG layer 518, a third barrier layer 520 and third NFSG layer 522 are deposited to form an IMD layer 521 as shown in FIG. 3(e). Second NFSG layer 518 and third NFSG layer 522 may be deposited by HDP-CVD as described above. Layers 518, 520, and 522 may be deposited in the same chamber, e.g., by HDP-CVD, without removing substrate 500 to enhance process integration for forming IMD layer 521. To prevent oxidation of copper layer 514 and contamination of the chamber, substrate 500 may be heated in a high-density Argon plasma without oxygen prior to depositing second FSG layer 518. A second lithography and etch forms vias 524 through layers 516, 518, 520 and 522 down to copper layer 514 as shown in FIG. 3(f). In FIG. 3(g), a third lithography and etch forms a second set of gaps 526. Gaps 526 define a second set of metal lines and vias 524 define a set of interconnects between the second set of metal lines and the first set of metal lines defined by gaps 510 and copper layer 514. Vias 524 and gaps 526 are then filled with a second bulk copper layer and the resulting structure is annealed and planarized as shown in FIG. 3(h). Gaps 526 define a second set of metal lines 528 and vias 524 define a set of interconnects 525 between the second set of metal lines 528 and the first set of metal lines 515.

Damascene processes are used in devices that use copper interconnects because there is currently no acceptable way to etch copper. Structures formed by damascene processes do not require a gap-fill dielectric and generally provide lower RC delays than similar structures formed using metal lines aluminum, tungsten, titanium or other metals. Furthermore, higher deposition rates may be used in damascene processes since gap-fill is not an issue. Any of barrier layers 506, 516 and 520 can be silicon nitride layers. Alternatively, it may be desirable to deposit one or more of barrier layers 506, 516 and 520 as silicon-carbon low-k barrier layers such as BLOK™ (Barrier Low K). BLOK™ is a trademark of Applied Materials, Inc. of Santa Clara, Calif.

V. Preferred Parameters for NFSG Deposition

The addition of nitrogen dopants during the HDP CVD process to produce NFSG has several unexpected beneficial effects on the material properties of the film when compared with FSG (which is itself generally superior to USG). One unexpected effect of including nitrogen is a reduction in the dielectric constant of the deposited film. If an FSG layer and an NFSG layer are deposited under similar conditions (i.e. deposition parameters and flow rates), except for the inclusion of nitrogen, then the NFSG film is observed to have a dielectric constant approximately 5% lower than the dielectric constant for the FSG film. This reduction in k translates directly into a corresponding increase in performance speed for integrated circuits manufactured with the process. Such nitrogen-related benefits are achieved in both gap-fill and damascene processes with appropriate parameter selection. Preferred parameters, including optimized flow rates, pressure, temperature, and RF power values for each of these two processes for producing NFSG in the exemplary chamber described above are summarized in Table I. In instances where two numbers appear for a flow rate, the first number represents the flow rate of gas through inlets in the side of the chamber and the second number represents the flow rate of gas through the inlets in the top of the chamber.

TABLE I

Preferred parameters for NFSG production

| Parameter | Gap-Fill Process | | Damascene Process | |
| --- | --- | --- | --- | --- |
| | Range | Preferred Value | Range | Preferred Value |
| $F(SiF_4)$ [sccm] | 50–65 | 58 | 60–80 | 70 |
| $F(SiH_4)$ [sccm] | (39–49) + (0–10) | 44 + 3 | (30–60) + (0–10) | 42 + 5 |
| $F(O_2)$ [sccm] | 120–150 | 137 | 200–300 | 260 |
| $F(Ar)$ [sccm] | (0–60) + (4.0–6.0) | 0.0 + 5.0 | (0–300) + (0–30) | 150 + 15 |
| $F(N_2)$ [sccm] | 10–60 | 30 | 30–120 | 90 |
| Pressure [mtorr] | 1–10 | 6 | 1–20 | 13 |
| Temperature [° C.] | 380–450 | 420 | 380–450 | 420 |
| Top RF Power Density [W/cm$^2$] | 2.5–6.4 | 4.8 | 2.5–6.4 | 4.8 |
| Side RF Power Density [W/cm$^2$] | 6.4–14.3 | 10.8 | 6.4–14.3 | 13.7 |
| Bias RF Power Density [W/cm$^2$] | 4.8–11.2 | 8.3 | 0.0–3.2 | 1.6 |

TABLE I-continued

Preferred parameters for NFSG production

In addition to providing the gaseous components set forth explicitly in Table I, He is also preferably included as a heat-transfer gas, with its flow being independently controlled through the inner and outer passages in the wafer chuck. Although the table indicates that nitrogen is added in its preferred form of $N_2$, it may be added in other forms in alternative embodiments. Suitable compounds for introducing nitrogen dopants include $N_2O$, $NH_3$, and $NF_3$.

i. Gap-Fill Processes

There are several features worthy of note regarding the NFSG layer production processes summarized in Table I. For example, in evaluating such processes, it is useful to consider the ratio of oxygen to total silicide flow rates, $R \equiv F(O_2)/[F(SiH_4)+F(SiF_4)]$, where F denotes a flow rate. In the case of prior-art HDP CVD gap-fill processes for producing FSG (with no nitrogen) $SiF_4$, $SiH_4$, $O_2$, and Ar are typically introduced into the HDP chamber at a pressure of approximately 5 mtorr. Suitable values of R for such gap-fill processes are narrowly constrained to a range of 1.35–1.5, with detrimental effects resulting from deviations outside this range. Provided the flow rates are adjusted such that R falls within this range, it is possible to produce an FSG film with a dielectric constant as low as 3.7. At lower values of R, however, a silicon-rich film is produced, which causes an undesirable increase in the dielectric constant. At higher values of R, the stability of the film, which is not as stable as some USG films, is further compromised as a result of the excess oxygen. Also, as apparent from the table, the Ar flow is preferably introduced only through top sources of the HDP chamber and not through side sources for gap-fill processes.

Notably, the NFSG process permits a significantly broader range on acceptable values of R, while at the same time producing a film with a lower dielectric constant. In the most preferred embodiment, described in Table I, the value of the dielectric constant is 3.5, approximately 5% less than the value produced by the similar non-nitrogen FSG process and affording a corresponding advantage in operation speed of the integrated circuit. The increase in acceptable R ranges for the NFSG process is apparent from the values given in Table I, where R falls within the range of 1.0 to 1.8. Within this expanded range, it is preferable that R be between the narrower range of 1.2–1.4 to achieve the best balance between reducing the dielectric constant and achieving adequate film stability. For example, the most preferred parameters listed in Table I produce a value of R=1.3, which falls outside the range of appropriate values for the prior-art FSG process.

As shown in Table I, the $N_2$ flow rate should be between 10 and 60 sccm for gap-fill processes, with a preferred range of 20–40 sccm. If the $N_2$ flow rate is less than approximately 10 sccm, the stability of the deposited NFSG film will be poor and if the $N_2$ flow rate exceeds approximately 60 sccm, the process will produce excessive sputtering. The preferred flow rate where other nitrogen-containing gases are used will depend on the stoichiometry of those gases, and should be adjusted appropriately, as understood by those of skill in the art.

The mechanism by which decreased values for the dielectric constant are produced can be understood by examining the fluorine concentration of the film, since it is known that an increase in fluorine concentration is correlated with a decrease in dielectric constant. A specific benefit of adding nitrogen is that its presence permits the concentration of fluorine in the film to be greater without impeding the deposition of a stable film. The fluorine concentration was measured using Fourier-transform infrared ("FTIR") transmission spectroscopy, which measures fluorine bonded to silicon rather than all of the fluorine in the film. To determine the fluorine concentration, the height of the Si—F peak at 937 cm$^{-1}$ was divided by the height of the Si—O stretching peak at 1090 cm$^{-1}$. This ratio, termed the peak-height ratio ("PHR"), was used to quantify the fluorine concentration. The dielectric constant was measured using a mercury probe. Thermal oxide film with a dielectric constant of 3.9 was used as the reference. In the prior art FSG process, for example, with R approximately 1.45, the concentration of fluorine is about 3.5% FTIR (approximately 6.3 at. %), while the nitrogen-inclusive NFSG process with R=1.3 produces a film with a fluorine concentration of about 6% FTIR (approximately 12 at. %).

Figure 4:
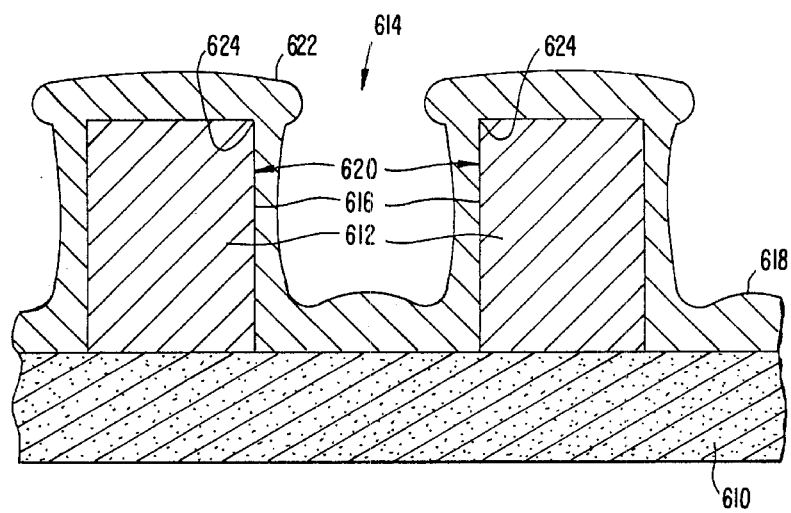
FIG. 4 shows a vertical cross-sectional view of a substrate, demonstrating the accumulation of dielectric material upon conductive features in a gap-fill process.
Figure 5:
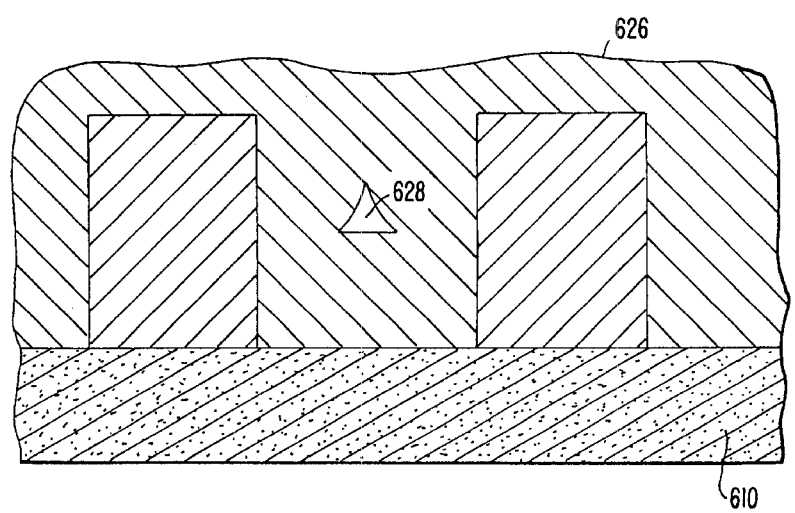
FIG. 5 shows a vertical cross-sectional view of the substrate shown in FIG. 4, demonstrating the formation of an interior void if the aspect ratio of the gap exceeds the gap-fill capability of the deposition technique.

The NFSG process also has superior gap-fill capabilities over the prior-art FSG process. The effectiveness of gap filling is commonly defined in terms of the largest aspect ratio that can be substantially 100% filled, which may be understood with reference to FIGS. 4 and 5. The aspect ratio is defined as the ratio of the height of a gap to its width. As the feature dimensions of integrated circuits decrease, the aspect ratio of gaps increases and it becomes more difficult to fill the gaps completely between adjacent lines. FIG. 4 shows a vertical cross-sectional view of a substrate 610 having a layer of conductive features 612, defining gaps 614. The side walls 616 of the gap are formed by one edge of adjacent conductive features 612. During gap-fill deposition, dielectric material 618 accumulates on the surfaces 620 of the conductive features 612, as well as the substrate 610 and forms overhangs 622 located at the corners 624 of the conductive features 612. As deposition of the dielectric layer 616 continues, the overhangs 622 typically grow together faster than the gap 614 is filled until a dielectric layer 626 is formed, creating an interior void 628, shown more clearly in FIG. 5. In this fashion, the dielectric layer 626 prevents deposition onto the interior void 628, which may be problematic to device fabrication, operation, and reliability. Using the prior-art FSG process, the maximum aspect ratio for which 100% gap fill is possible is approximately 2.8:1. This maximum aspect ratio is increased to at least 3.3:1 using the NFSG process, and it is possible to fill gaps as narrow as 0.16 μm. This improvement in gap-fill capability results in part from the absence of side argon flow.

In should be noted that the parameters specified for "gap-fill" processes may also be used in damascene applications. It is, however, preferable to make use of the high-throughput capabilities of damascene processes according to the processes discussed below.

ii. Damascene Processes

The principal difference between the damascene NFSG and gap-fill NFSG processes is the very low bias power that is applied. The bias power density applied during the damascene should be less than 3.2 W/cm$^2$, and is preferably 1.6 W/cm$^2$. The principal reason for applying a non-zero bias is to use the bias for additional control over the wafer temperature. With the preferred 1.6 W/cm$^2$ bias, the deposition rate for the film can be greater than 7000 Å/min, which is salutary for damascene applications. Higher deposition rates are generally possible for damascene processes when compared with gap-fill process because the concern that inaccessible voids will be created between metal lines is absent. The optimized flow parameters are also somewhat different in the damascene process such that the ratio of flow rates for oxygen and silicides R should be within the range 1.2–3.0, and is preferably between 1.8 and 2.5. This value should be compared with prior-art damascene processes in which R is within the range of 6.0 to 7.0, such a large value being required for processes that do not use silane to prevent the deposited film from containing too much fluorine, thereby preventing degradation of the stability of the film. As shown in Table I, the preferred N$_2$ flow rate is between 30 and 120 sccm. At lower flow rates, the stability of the deposited NFSG film is adversely affected and at higher rates, the dielectric constant increases to an undesirable value. As understood by those of skill in the art, the preferred flow rate may be adjusted according to the stoichiometry of nitrogen-containing gases used alternatively to N$_2$.

It is hypothesized that the difference in R between the gap-fill and damascene nitrogen-inclusive processes is related to the sharp difference in applied bias used for the two processes. The relatively high bias applied during the gap-fill process causes much more sputtering than a low-bias process, which in turn causes the film surface to be more reactive to other species, including O$_2$. Sputtering releases hydrogen atoms from Si—H bonds on the surface, which then react with other radicals. As a result, these dangling Si bonds are more available to react with other species, permitting the available oxygen, which is more reactive than other species, to form more Si—O bonds with silicon atoms. In order to compensate for the absence of this effect in the damascene process, a higher concentration of O$_2$ is needed.

For both the gap-fill and damascene processes, there is an improvement in stability of the NFSG film over prior-art FSG films. Fluorine dopants in silicon oxide films act to reduce the dielectric constant but the diffusion adversely affects the stability of the film. The additional introduction of nitrogen limits the degree of fluorine diffusion, even at relatively high fluorine concentrations, so that improved film stability is achieved with NFSG. This improvement in stability has been confirmed by thermal annealing tests performed on metal stacks and/or using a Si$_3$N$_4$ cap. For gap-fill films, this confirmation included testing both NFSG/metal and metal/NFSG depositions for six cycles at 410° C. For damascene films, this included annealing a Si$_3$N$_4$ cap after CMP for two hours at 450° C.

Having fully described several embodiments of the present invention, many other equivalent or alternative methods of producing the NFSG film of the present invention will be apparent to those of skill in the art. These alternatives and equivalents are intended to be included within the scope of the invention, as defined by the following claims.

What is claimed is:

1. A method for depositing a film on a substrate in a process chamber, the method comprising the steps of:
   (a) providing a gaseous mixture to the chamber, the gaseous mixture comprising a silicon-containing gas, a fluorine-containing gas, an oxygen-containing gas, and a nitrogen-containing gas;
   (b) generating a high-density plasma from the gaseous mixture;

(c) applying a bias to the substrate at a bias power density between 4.8 and 11.2 W/cm$^2$; and (d) depositing a nitrofluorinated silicate glass (NFSG) layer onto the substrate using the plasma.

2. The method according to claim 1 wherein the bias power density applied to the substrate is substantially equal to 8.3 W/cm$^2$.

3. The method according to claim 1 wherein the nitrogen-containing gas is N$_2$.

4. The method according to claim 3 wherein the N$_2$ is provided to the chamber with a flow rate between 20 and 40 sccm.

5. The method according to claim 1 wherein the nitrogen-containing gas is selected from the group consisting of N$_2$O, NH$_3$, and NF$_3$.

6. The method according to claim 1 wherein the fluorine-containing gas is SiF$_4$.

7. The method according to claim 1 wherein the silicon-containing gas is a silane.

8. The method according to claim 1 wherein a ratio of a flow rate of the oxygen-containing gas to a combined flow rate of all silicon-containing gases in the gaseous mixture is between 1.0 and 1.8.

9. The method according to claim 8 wherein the ratio is between 1.2 and 1.4.

10. The method according to claim 1 wherein the gaseous mixture further comprises an inert gas.

11. The method according to claim 10 wherein the inert gas is Ar.

12. A method for depositing a nitrogen- and fluorine-doped silicon oxide layer on a substrate in a process chamber, the method comprising the steps of:

(a) flowing process gas comprising SiF$_4$, SiH$_4$, O$_2$, N$_2$, and Ar into the chamber, wherein a ratio of a flow rate of the O$_2$ to a combined flow rate of the SiF$_4$ and SiH$_4$ is between 1.2 and 1.4 and a flow rate of the N$_2$ is between 20 and 40 sccm;

(b) forming a high-density plasma from the process gas by applying source RF power to the plasma;

(c) applying a bias to the substrate at a bias power density substantially equal to 8.3 W/cm$^2$; and (d) depositing the dielectric layer onto the substrate using the high-density plasma.

13. A method for depositing a film on a substrate in a process chamber, the method comprising the steps of:

(a) providing a gaseous mixture to the chamber, the gaseous mixture comprising a silicon-containing gas, a fluorine-containing gas, an oxygen-containing gas, and a nitrogen-containing gas;

(b) generating a high-density plasma from the gaseous mixture;

(c) applying a bias to the substrate at a bias power density less than 3.2 W/cm$^2$; and (d) depositing a nitrofluorinated silicate glass (NFSG) layer onto the substrate using the plasma.

14. The method according to claim 13 wherein the bias power density applied to the substrate is substantially equal to 1.6 W/cm$^2$.

15. The method according to claim 13 wherein the nitrogen-containing gas is N$_2$.

16. The method according to claim 15 wherein the N$_2$ has a flow rate between 30 and 120 sccm.

17. The method according to claim 13 wherein the nitrogen-containing gas is selected from the group consisting of N$_2$O, NH$_3$, and NF$_3$.

18. The method according to claim 13 wherein the fluorine-containing gas is SiF$_4$.

19. The method according to claim 13 wherein the silicon-containing gas is a silane.

20. The method according to claim 13 wherein a ratio of a flow rate of the oxygen-containing gas to a combined flow rate of all silicon-containing gases in the gaseous mixture is between 1.2 and 3.0.

21. The method according to claim 20 wherein the ratio is between 1.8 and 2.5.

22. The method according to claim 13 wherein the gaseous mixture further comprises an inert gas.

23. The method according to claim 22 wherein the inert gas is Ar.

24. The method according to claim 13 wherein the NFSG layer is deposited on a barrier layer previously formed on the substrate.

25. The method according to claim 24 wherein the barrier layer is a silicon nitride layer.

26. The method according to claim 25 wherein the NFSG layer and the silicon nitride layer are deposited as part of a copper damascene process.

27. The method according to claim 26 further comprising heating the substrate in an in situ plasma that does not comprise an oxygen source, wherein the step of heating the substrate is performed prior to the step of depositing the NFSG layer.

28. The method according to claim 13 further comprising the steps of:

(a) depositing a layer of copper on the substrate; and (b) heating the substrate in an in situ plasma that does not comprise an oxygen source,
wherein both the steps of depositing a layer of copper and the heating the substrate are performed prior to the step of depositing the NFSG layer.

29. A computer-readable storage medium having a computer-readable program embodied therein for directing operation of a substrate processing system including a process chamber; a plasma generation system; a substrate holder; and a gas delivery system configured to introduce gases into the process chamber, the computer-readable program including instructions for operating the substrate processing system to form a thin film of nitrofluorinated silicate glass (NFSG) on a substrate disposed in the processing chamber in accordance with the following:

(a) providing a gaseous mixture to the processing chamber, the gaseous mixture comprising a silicon-containing gas, a fluorine-containing gas, an oxygen-containing gas, and a nitrogen-containing gas;

(b) generating a high-density plasma from the gaseous mixture;

(c) applying a bias to the substrate; and (d) depositing the NFSG onto the substrate using the plasma.

30. The computer-readable storage medium according to claim 29 wherein the bias has a bias power density between 4.8 and 11.2 W/cm$^2$.

31. The method according to claim 29 wherein the bias has a bias power density less than, 3.2 W/cm$^2$.

32. A substrate processing system comprising:

(a) a housing defining a process chamber;

(b) a high-density plasma generating system operatively coupled to the process chamber;

(c) a substrate holder configured to hold a substrate during substrate processing;

(d) a gas-delivery system configured to introduce gases into the process chamber, including sources for a silicon-containing gas, a fluorine-containing gas, an oxygen-containing gas, and a nitrogen-containing gas;

(e) a pressure-control system for maintaining a selected pressure within the process chamber;

(f) a controller for controlling the high-density plasma generating system, the gas-delivery system, and the pressure-control system; and (g) a memory coupled to the controller, the memory comprising a computer-readable medium having a computer-readable program embodied therein for directing operation of the substrate processing system, the computer-readable program including (i) instructions to control the gas-delivery system to flow a gaseous mixture containing flows of the silicon-containing gas, the fluorine-containing gas, the nitrogen-containing gas, and the oxygen-containing gas;

(ii) instructions to control the high-density plasma generating system to generate a high-density plasma from the gaseous mixture and to apply a bias to the substrate; and (iii) instructions to control the substrate processing system to deposit a nitrofluorinated silicate glass layer onto the substrate using the high-density plasma.

33. The substrate processing system according to claim 32 wherein the bias applied to the substrate has a bias power density between 4.8 and 11.2 W/cm$^2$.

34. The substrate processing system according to claim 32 wherein the bias applied to the substrate has a bias power density less than 3.2 W/cm$^2$.

* * * * *